United States Patent
Rookes et al.

(10) Patent No.: US 6,611,541 B2
(45) Date of Patent: Aug. 26, 2003

(54) LASER DIODE MATCHING CIRCUIT AND METHOD OF IMPEDANCE MATCHING THEREFOR

(75) Inventors: Christian Rookes, Ipswich (GB); Ian Mitchell, Ipswich (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/078,420

(22) Filed: Feb. 21, 2002

(65) Prior Publication Data

US 2002/0181522 A1 Dec. 5, 2002

(30) Foreign Application Priority Data

Mar. 30, 2001 (EP) ............................................ 01303099

(51) Int. Cl.⁷ ................................................. H01S 3/00
(52) U.S. Cl. .................................................... 372/38.02
(58) Field of Search .............................. 372/38.1–38.09

(56) References Cited

U.S. PATENT DOCUMENTS

| | | | |
|---|---|---|---|
| 4,761,788 A | 8/1988 | Dietrich et al. ................ | 372/36 |
| 5,371,755 A | 12/1994 | Murata et al. ............ | 372/38.02 |
| 5,444,727 A | 8/1995 | Mathoorasing ............. | 372/38.1 |
| 5,706,303 A | 1/1998 | Lawrence ................. | 372/38.02 |
| 5,982,793 A | * 11/1999 | Kobayashi et al. ......... | 372/38.1 |

* cited by examiner

Primary Examiner—Quyen Leung

(57) ABSTRACT

A laser diode is matched to a laser driver IC by a microwave stub to take advantage of radio frequency/microwave effects of electrical conductors on high frequency signals. The microwave stub is a piece of microwave transmission line with a characteristic impedance defined by its physical dimensions and its material. A transmission line having a distributed set of capacitors and inductors is tuned over a range of frequencies by changing its operating length/width. A capacitor short circuits the microwave stub to ground. The capacitor position along the microwave stub determines the microwave transmission line operating length (and hence frequency). Therefore, a matching network is tuned by changing the capacitor position along the microwave stub instead of using several different valued capacitors.

12 Claims, 4 Drawing Sheets

LASER DIODE MATCHING CIRCUIT AND METHOD OF IMPEDANCE MATCHING THEREFOR

This invention relates, in general, to a laser diode matching circuit and is particularly, but not exclusively, applicable to impedance matching in fibre optic transceivers in which the laser diode is packaged in a transistor outline (TO) package.

A conventional fibre optic transceiver module contains a transmitter section and a receiver section. The transmitter section normally comprises a laser diode in a package (such as a TO-can having suitably embedded and extended electrical contact leads) that is driven by an integrated circuit or a set of discrete components that form the so-called "Laser Diode Driver". The laser diode driver drives current through the laser diode to produce pulses of light (out of the laser diode) at given time intervals dependent on the input signal applied at the input of the laser diode driver.

As driving, i.e. operating, speeds increase into the gigahertz (GHz) region, it becomes increasingly important to match electrically the output impedance of the laser diode driver to the input impedance of the laser diode. A poor electrical match will generally result in electrical reflections (through the electrical leads), parasitic resonance caused by stray capacitances and inductances and general noise. Failure to provide a clean drive signal therefore ultimately causes a poor quality optical signal that could contain degradations in amplitude and time. Reflections through leads and tracks (resulting from impedance mismatches) cause ripples or oscillations on a time domain detection signal. More especially, parasitic resonance can lead to deformation of a detection eye (of the time domain signal) that is used to differentiate between binary logic levels (i.e. lasing and dark operation).

Unfortunately, the construction of laser diode packages inherently leads to the introduction of parasitic resonance since ingress and egress of electrical leads into the TO-can are typically through a glass-resin insulating sleeve set within a metal plate, e.g. made of mild steel. With the electrical leads, in operation, carrying current, the glass-resin (or equivalent) insulating sleeve acts as a dielectric and forms a capacitor that resonates at certain fibre operating frequencies. Also, while the length of the electrical leads may be optimised to prevent electrical reflections, the inexorable variation in nominal circuit component values results in an output from the laser diode driver being load/impedance circuit specific; this means that tuning of individual circuits for optimised operation is required.

Generally, in order to effectively improve laser driver operation it is necessary to kill the parasitic resonances and/or reflections; this can be achieved by using a parallel dummy load to present an alternative path to earth potential (in the case of a filter) or by restricting parasitic resonances and reflections by improving impedance matching.

Matching of a laser diode to a laser diode driver is presently accomplished through use a simple resistor-capacitor (RC) shunt network to ground or the supply voltage, $V_{cc}$. The RC shunt network is placed between the laser diode and laser driver circuit, with the shunt providing a matched impedance at a certain frequency determined by values of the individual components of the RC shunt network. Unfortunately, the problems of using an RC shunt are that: i) the matching frequency is insufficiently broad enough to cover the entire operating frequency range required; ii) the match is tuneable only by replacing the resistor and capacitor values, i.e. the shunt is circuit specific; and iii) the shunt network is too harsh and results in loss of bandwidth. Furthermore, use of an RC network (i.e. a filter) in a laser device, typically operating at a bit rate in excess of two gigabits per second (2 Gbit/s), is compromised in terms of a clean detection window (in the time domain eye detection signal). Clearly, at laser operating frequencies and correspondingly high data rates, it is necessary for a steady state signal condition to be met quickly in order to maintain integrity in the detection algorithm that is operational on the time domain eye signal. However, the RC shunt achieves the requisite damping effect in logic level signal transitions (viewed in the time domain) when employing a large time constant that is incompatible with the relatively short rise and fall time allotted to data level stabilisation at laser operating frequencies.

According to a first aspect of the present invention there is provided a method of impedance matching a laser driver with a laser diode coupled thereto, the method characterised by: coupling a common node located between the laser driver and the laser diode to a reference potential through a matching stub and an AC shorting capacitor; and tapping the matching stub with the AC shorting capacitor to provide an impedance match between the laser driver (20) and the laser diode.

In another aspect of the present invention there is provided a semiconductor laser control circuit comprising a laser driver integrated circuit, the semiconductor laser control circuit characterised by: at least one microwave transmission line connectable to the laser driver integrated circuit, the microwave transmission line further coupled to a reference potential plane of the semiconductor laser control circuit through an AC shorting capacitor or a zero Ohm link to provide, in use, a matching impedance between the laser driver integrated circuit and a semiconductor laser.

In yet another aspect of the present invention there is provided a semiconductor laser arrangement comprising a TO-can having a laser diode and a laser driver control assembly operable to control the laser diode, characterised in that: the laser driver control assembly includes a microwave transmission line connected to a laser driver integrated circuit through a stub resistor, the microwave transmission line further coupled to a reference potential plane through an AC shorting capacitor that taps the microwave transmission line to provide impedance matching between the laser driver integrated circuit and the TO-can.

Preferably, a stub-matching element of the present invention is created using a microstrip line on a PCB, the microstrip line having a characteristic impedance $Z_0$. The microstrip line is connected at a node between the laser diode and laser diode driver devices at some (preferably optimum) distance away from the laser diode. If the Q-factor of the stub is to be reduced, the microstrip line can be connected via a series resistor, $R_{stub}$; this allows for a broader matching effect without changing the position of a stub capacitor $C_{stub}$. If an ac short is required, the microstrip line is terminated to a suitable point (nominally Ground) via a capacitor, $C_{stub}$. If a DC/AC short is required, the microstrip is simply connected to the reference point by a zero ohm (0 Ω) link.

A plurality of stub-matching elements of differing lengths may be provided on a single PCB.

Advantageously, the present invention provides a mechanism for improving impedance matching in laser diode driver circuitry, the mechanism making use of physical properties intrinsic to the operating medium to control electrical effects. The present invention is inexpensive to implement in a laser diode driver IC (or on an associated printed circuit board, PCB), with the circuit of the present invention readily adaptable to different TO-cans or the like. In other words, the present invention removes the constraints on impedance matching from a circuit specific arrangement to a general case solution. Using stub-matching and, more generally, distributed elements to match a laser diode to a laser diode driver provides a more accurate and versatile method of impedance matching than the normal RC (filter) shunt matching method.

Exemplary embodiments of the present invention will now be described with reference to the accompanying drawings, in which.

Figure 1:
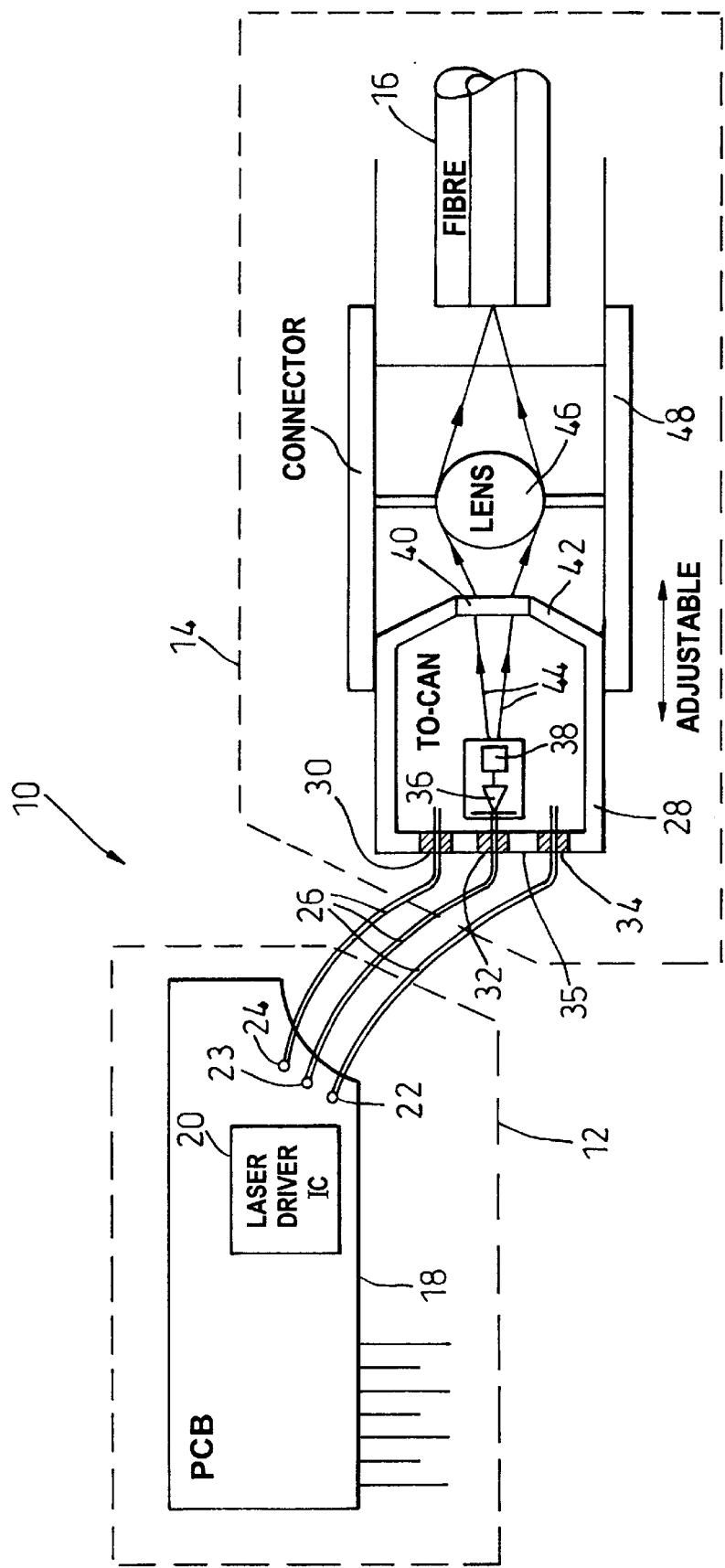
FIG. 1 is a schematic block diagram of a laser diode driver circuit and associated TO-can that can support the concepts of the present invention.
Figure 2:
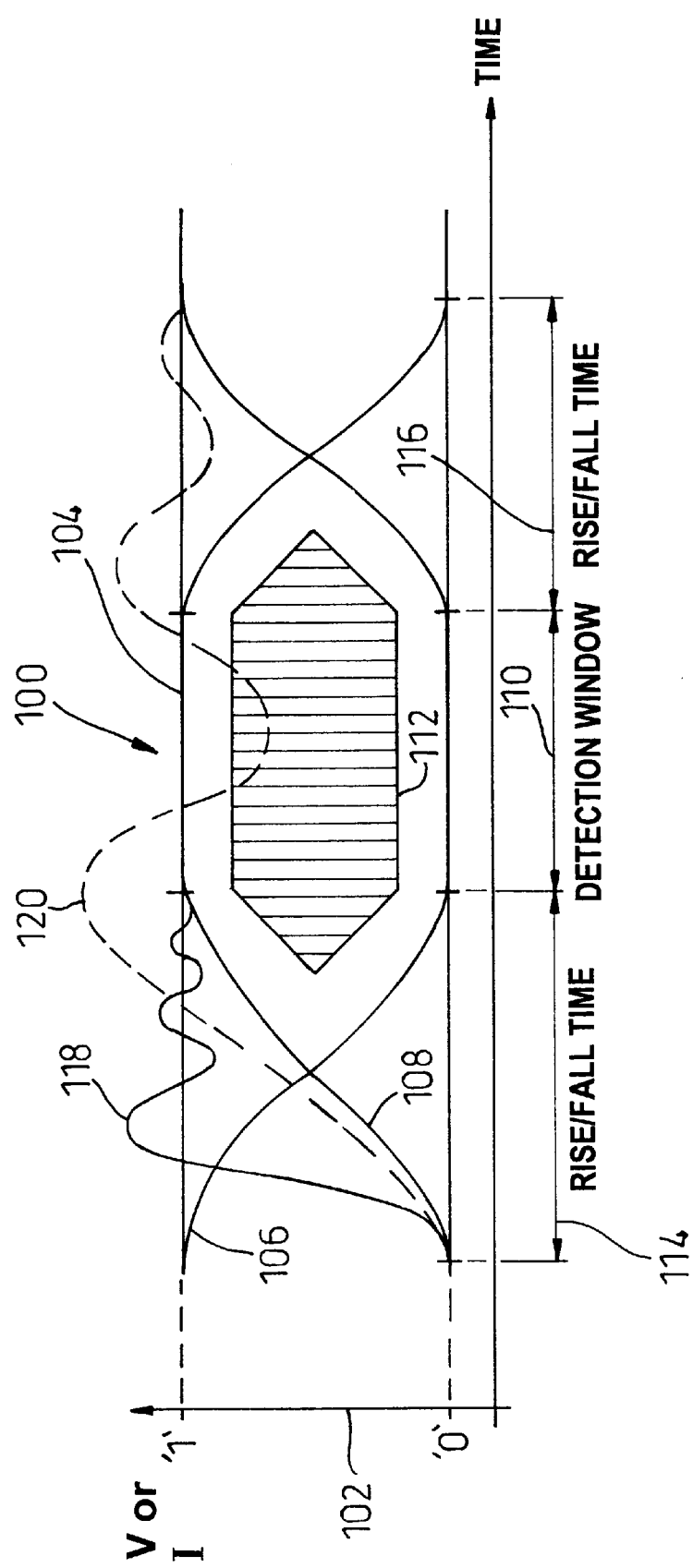
FIG. 2 is a conventional eye diagram showing time domain representations of data level transitions.
Figure 4:
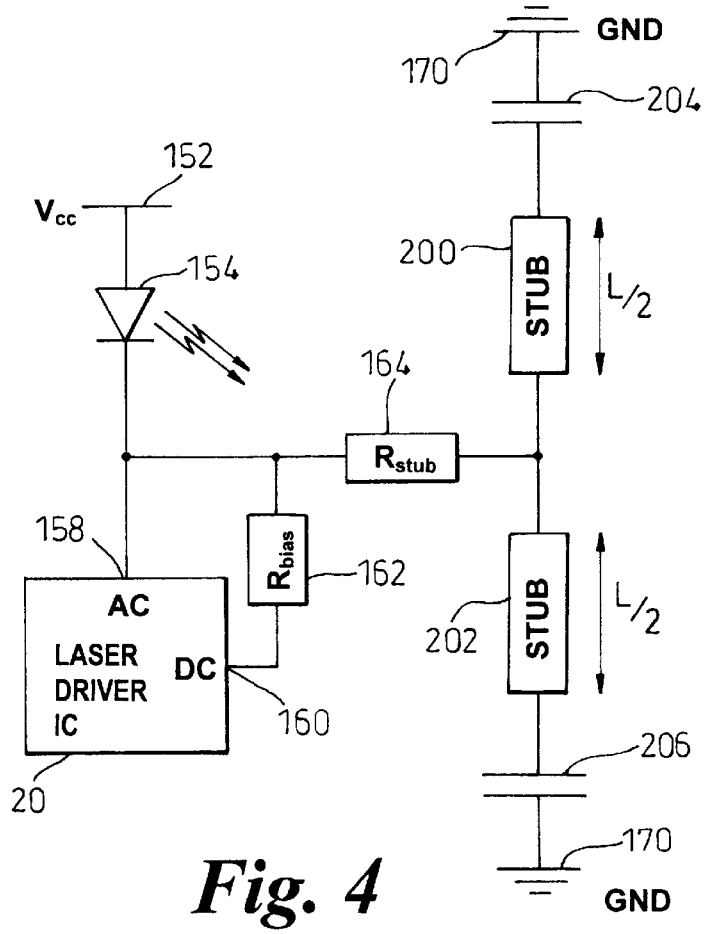
Figure 5:
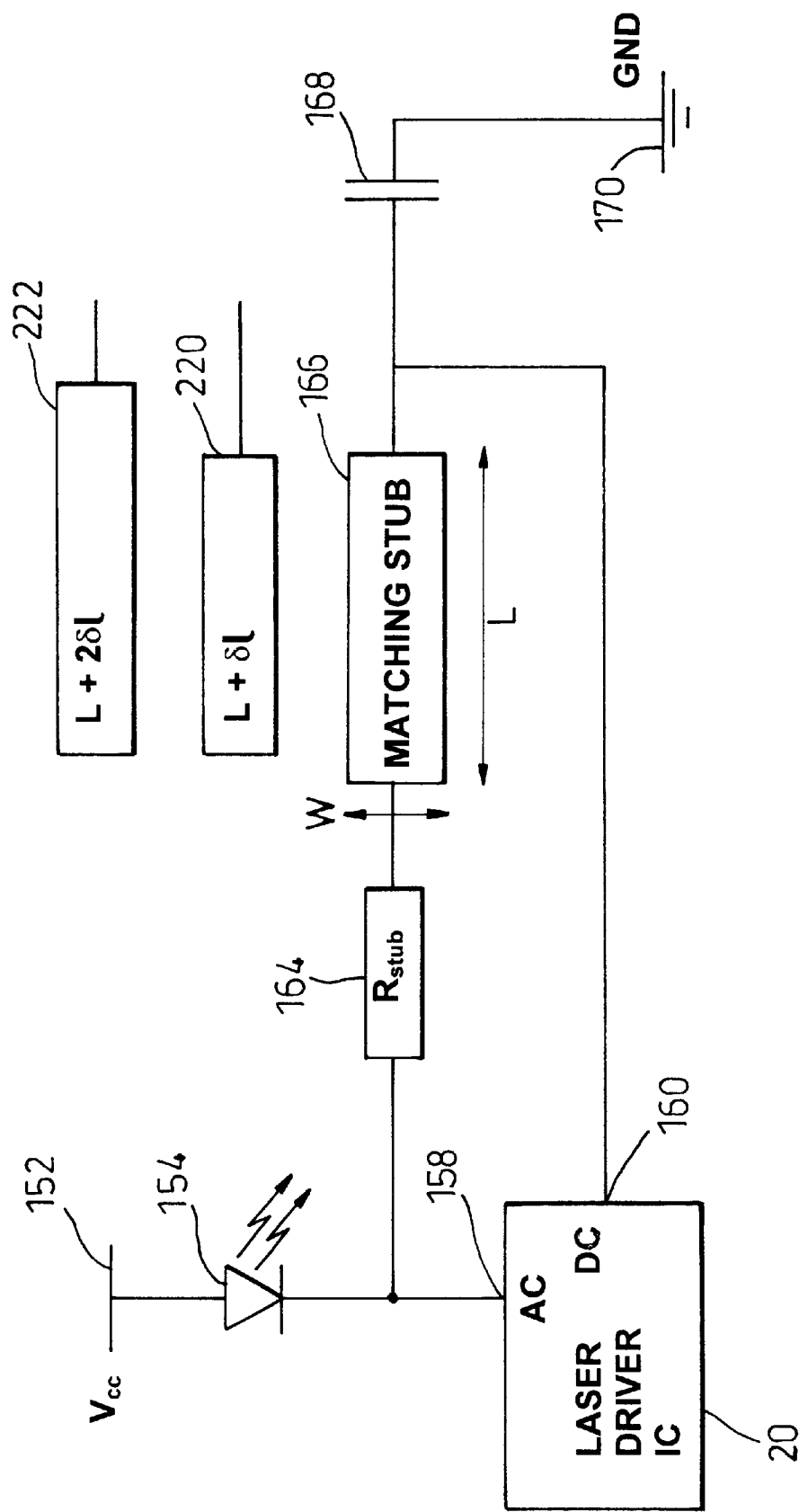

FIG. 4 is an alternative embodiment of an impedance stub-matching circuit according to the present invention; and FIG. 5 is another embodiment of an impedance stub-matching circuit according to the present invention Before discussing the present invention in detail, reference is first made to FIGS. 1 and 2 that illustrate, in context, laser circuitry and data recovery issues in a time domain eye diagram, respectively.

FIG. 1 is a schematic block diagram 10 of a laser diode driver circuit 12 and associated TO-can configuration 14 (shown in situ with an optical fibre 16) that can support the concepts of the present invention. The laser diode driver circuit 12 is typically implemented on a PCB 18 supporting a plurality of ICs and discrete components, including circuit tracks and vias between multiple layers in the PCB 18. The PCB 18 includes a laser driver IC 20 (or equivalent driver stage, as will be understood), the laser driver IC 20 having associated package lead line contacts 22–24. In use, the laser driver is coupled to associated TO-can configuration 14 through insulated wires between the package lead line contacts 22–24 and a TO-can 28.

The TO-can 28 is generally of metallic construction with wires feeding components in the TO-can through insulated glass resin sleeves 30–34 set within a base plate 35. The TO can, in the context of a transceiver device, includes a photodiode 36 and a laser diode (typically both further encased within a metal block 40 having a suitable ingress/egress point). The TO-can 28 further includes a glass or crystal window 40 in a cap-end 42 of the TO-can 28, the cap-end 42 remote from the base plate 35. To provide coupling of light 44 emitted from the laser diode 38 (via the glass or crystal window 40), a ball lens 46 located within a connector 48 focuses light 44 into (or out off, as the case may be) the optical fibre 16. The connector 48 therefore provides an adjustable connection conduit between the TO-can 28 and the optical fibre 16.

Looking briefly to FIG. 2, there is shown a time domain representation of an eye diagram 100. An ordinate axis 102 can be expressed in terms of, say, voltage or current, with the ordinate axis having defined logic zero and logic one levels, with a logic one indicative of detected laser light and a logic zero amounting to a dark level when the laser is not in active lasing operation. Transitions 106, 108 between the logic zero and logic one levels result in a characteristic eye shape 104 when viewed repeatedly over time. Data interpretation algorithms operate to recover logic levels during a detection window 110. It is preferred that a central portion 112 of the eye is devoid from signal incursions so that the respective logic levels are clearly separable, thereby avoiding false attribution of an incorrect logic level to incident data. Ideally, therefore, data recovery is centred within the eye 104, with rise/fall times 114 and 116 discarded from consideration. The rise/fall times are therefore contiguous with to each eye 104. It should also be appreciated that it is preferable that the eye 104 is also not bounded in the ordinate axis by interfering signals that could cause falsing of the detection algorithm, as will be readily appreciated.

In relation to rise time 114, for example, an ideal matched circuit or resonance-insulated scenario is shown in FIG. 2 in which a signal transition 118 undergoes complete damping before the detection window. Also shown in FIG. 2 is an instance where a signal transition 120 settles relatively slowly with the result that eye boundary conditions are violated to obscure coherent data recovery by fluctuating the eye boundary into the central portion 112 that is supposedly devoid of signal transitions.

In developing the present invention, it has been appreciated that laser operating frequencies above about 2 GHz result in $\lambda/8$ wavelengths of about ten millimeters (10 mm). In the context of matching a laser diode with a laser driver IC, the present invention contemplates the use of a microwave stub. The stub is used in place of the shunt resistor/capacitor network and takes advantage of RF/microwave effects of electrical conductors on high frequency signals. The stub is a piece of microwave transmission line with a characteristic impedance defined by its length, width, thickness and the PCB material of which it is made. Because a transmission line has the characteristics of a distributed set of capacitors and inductors it can be tuned to work over a range of frequencies by changing its operating length/width. A capacitor is used to short circuit between the stub and ground, with the position of the capacitor along the stub determining the operating length (and hence the frequency) of the microwave transmission line. In other words, according to the present invention, a matching network can be tuned simply by changing the position of the capacitor along the stub instead of having to have a number of different valued capacitors to hand.

Figure 3:
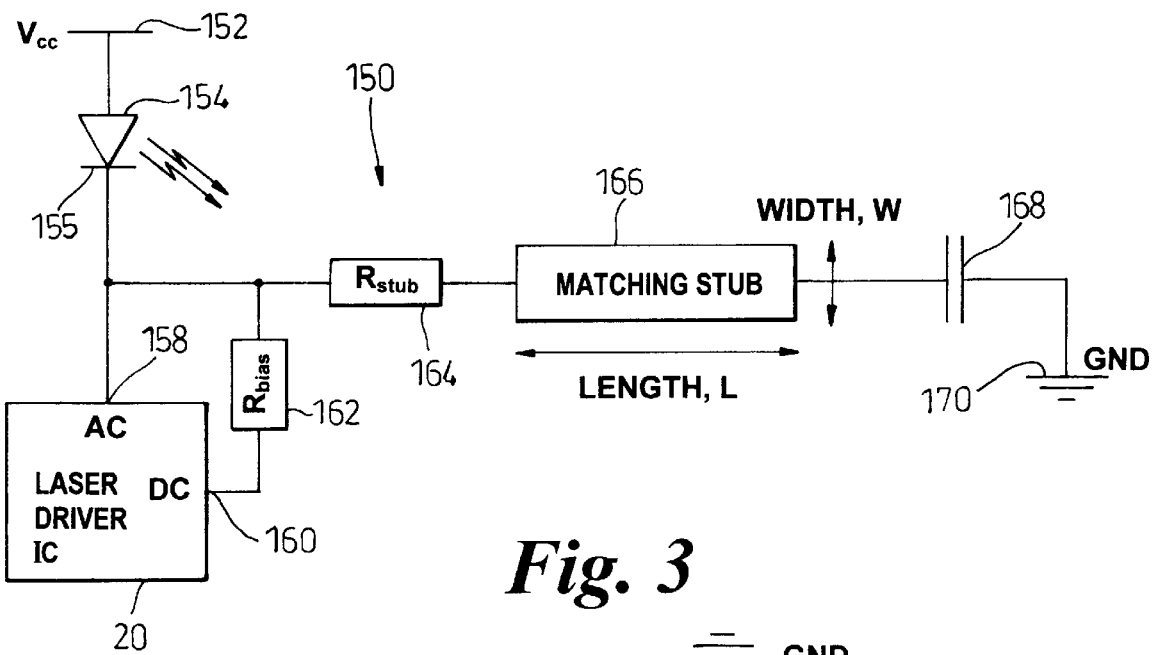
FIG. 3 is a circuit diagram of an impedance stub-matching circuit according to a preferred embodiment of the present invention.

FIG. 3 is a circuit diagram of an impedance stub-matching circuit 150 according to a preferred embodiment of the present invention. A laser diode supply $V_{cc}$ 152, such as a 3.3 volt (V) or 5V supply, allows a laser diode 154 to draw current therefrom. Coupled to the laser diode 154, at an electrode 155 remote to the supply $V_{cc}$, is a laser diode driver 156 arranged to provide control signals to the laser diode 154. More specifically, an AC input 158 is coupled to the electrode 155, whereas a DC input is coupled to the electrode 155 via a biasing resistor 162 ($R_{bias}$). The biasing resistor prevents the passage of radio frequency (RF) current through the DC path to the laser diode driver IC 20. As will be understood, in operation, the laser diode 154 pulls greater levels of current from the supply 152 to move (or transition) to a logic one level from a dark output.

The electrode 155 (of the laser diode 154) and the biasing resistor 162 are also coupled to a series combination of a stub resistor ($R_{stub}$) 164, a matching stub 168 of length L and width W and an AC (alternating current) shorting capacitor 168 to ground 170. The matching stub 164 is typically a transmission line that takes any suitable form, including a geometric, asymmetric or other irregular shape. The stub resistor 164, in essence, provides a real component to the total impedance provided by the series combination of the stub resistor 164 and the matching stub 166. The matching stub 166 is tapped by the capacitor to ground at an appropriate point somewhere along its length to provide appropriate impedance matching of the laser diode driver IC 20 and the TO-can 28 (as represented by the laser diode 154). Of course, the matching stub 166 could itself be trimmed to an appropriate length in a manufacturing process to provide component impedance matching whereby the shorting capacitor 168 is coupled between (i.e. taps) the end of the matching stub 166 and ground 170 (or any other suitable reference potential plane).

The stub resistor (Rstub) can, in certain instances, take a zero Ohm value. The stub resistor acts to attenuate the impedance effect of the matching stub 164.

While the DC path may only draw (on a continuous basis) about one milli-Ampere (1 mA) of current to maintain lasing operation, the AC path draws, perhaps, about 40 mA.

To lower the Q-factor of the circuit of FIG. 3, the configuration of FIG. 4 can be implemented in which the single matching stub 166 to ground 170 is replaced by parallel matching stubs 200 and 202 each coupled in series to ground via respective first 204 and second 206 AC shorting capacitor, respectively. The parallel matching stubs 200 and 202 are preferably identical and take length L/2.

As another optional design alternative, a plurality of parallel matching stubs (reference numerals 166, 220 and 222 in FIG. 5) may be provided on a PCB, with only an appropriately dimensioned matching stub selectively coupled to the stub resistor 164 and ground 170 (via AC shorting capacitor 168). The plurality of matching stubs, which may be microstrip lines or strip lines, typically vary one from another by integral (or otherwise) variations in length, δl. The dimensional change therefore provides the variation in impedance necessary for component variation from a standpoint of impedance matching.

FIG. 5 also illustrates a further variation of the basic design concept in which the biasing resistor (of FIG. 3) is omitted and the DC input 160 coupled to a point intermediate between the matching stub 188 and AC shorting capacitor 168. This particular configuration is realisable because generally RF current generally finds a path directly to ground. In other words, it is possible to combine the matching stub 166 with the DC bias line to provide good RF rejection at high frequencies for the bias line whilst also presenting a negligible resistance in the DC line.

In situations where board space is at a premium, it is contemplated that the matching stubs (or stubs) can be buried within a multi-layer board structure, with through vias between layers providing access to contact pads.

It will, of course, be appreciated that the preferred embodiment has been given by way of example only and that modifications in detail may be made within the scope of the present invention. For example, two or more parallel stubs can be provided in the context of FIG. 4, and the features of FIG. 5 (e.g. the omission of the biasing resistor) can be incorporated into FIG. 4. Furthermore, while it is generally envisaged that the matching stub will be dc isolated from an RF ground plane (having the reference potential), it may be desirable to omit the stub capacitor in instances where a DC/AC short is required in which case the matching stub is coupled to the reference plane by a zero Ohm (0 Ω) link.

What is claimed is:

1. A method of impedance matching a laser driver with a laser diode coupled thereto, comprising:

coupling a common node located between the laser driver and the laser diode to a reference potential through a matching stub and an AC shorting capacitor; and tapping the matching stub with the AC shorting capacitor to provide an impedance match between the laser driver and the laser diode.

2. The method of claim 1, further comprising: coupling a stub resistor between the common node and the matching stub, so the stub resistor provides a real component to the impedance provided by the combination of the matching stub and the AC shorting capacitor.

3. A semiconductor laser control circuit for a laser driver integrated circuit, the semiconductor laser control circuit including:

at least one microwave transmission line connectable to the laser driver integrated circuit, an AC shorting capacitor connected to the microwave transmission line for coupling a reference potential plane of the semiconductor laser control circuit to the transmission line or a substantially zero ohm link, the transmission line and the shorting capacitor or zero ohm link being arranged for providing a matching impedance between the laser driver integrated circuit and a semiconductor laser.

4. The semiconductor laser control circuit of claim 3, wherein the at least one microwave transmission line further comprises a plurality of parallel transmission lines, an AC shorting capacitor for coupling each of the plurality of transmission lines to the reference potential plane.

5. The semiconductor laser control circuit of claim 3, further comprising:

a stub resistor coupled between a selected one of said at least one microwave transmission lines and an AC input to the laser driver integrated circuit.

6. The semiconductor laser control circuit of claim 5, further comprising:

a biasing resistor coupled to a DC input of the laser driver integrated circuit, the biasing resistor further coupled to the stub resistor and an AC input of the laser driver integrated circuit.

7. The semiconductor laser control circuit of claim 5, wherein the shorting capacitor is provided to the exclusion of the substantially zero ohm link and the laser driver integrated circuit includes a DC input coupled to a circuit node between the AC shorting capacitor and said at least one microwave transmission line.

8. An optical transceiver or transmitter comprising the semiconductor laser control circuit of claim 3.

9. A semiconductor laser arrangement comprising a TO-can having a laser diode and a laser driver control assembly operable to control the laser diode:

the laser driver control assembly including a microwave transmission line connected to a laser driver integrated circuit through a stub resistor, the microwave transmission line further coupled to a reference potential plane through an AC shorting capacitor for tapping the microwave transmission line to provide impedance matching between the laser driver integrated circuit and the TO-can.

10. The semiconductor laser arrangement of claim 9, wherein the reference potential plane is a ground plane.

11. The semiconductor laser arrangement of claim 9, wherein the microwave transmission line is buried in a multi-layer PCB substrate.

12. An optical transceiver or transmitter comprising the semiconductor laser arrangement of claim 9.

* * * * *